United States Patent
Joo et al.

(10) Patent No.: US 12,159,817 B2
(45) Date of Patent: Dec. 3, 2024

(54) HIGH PERFORMANCE SEMICONDUCTOR DEVICE

(71) Applicant: Cree, Inc., Durham, NC (US)

(72) Inventors: Sung Chul Joo, Cary, NC (US); Ulf Hakan Andre, Hillsborough, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 704 days.

(21) Appl. No.: 17/371,410

(22) Filed: Jul. 9, 2021

(65) Prior Publication Data

US 2023/0010770 A1   Jan. 12, 2023

(51) Int. Cl.
*H01L 23/495* (2006.01)
*H01L 23/31* (2006.01)
*H01L 23/66* (2006.01)
*H05K 1/18* (2006.01)
*H05K 3/34* (2006.01)

(52) U.S. Cl.
CPC .... *H01L 23/49548* (2013.01); *H01L 23/3142* (2013.01); *H01L 23/49586* (2013.01); *H01L 23/66* (2013.01); *H05K 3/3426* (2013.01); *H01L 2223/6605* (2013.01); *H01L 2223/6644* (2013.01); *H05K 1/189* (2013.01)

(58) Field of Classification Search
None
See application file for complete search history.

(56) References Cited

U.S. PATENT DOCUMENTS

| | | | |
|---|---|---|---|
| 4,427,991 A | 1/1984 | Yamamura et al. | |
| 5,455,446 A * | 10/1995 | Suppelsa | H01L 23/49582 257/467 |
| 5,940,964 A | 8/1999 | Mugiya | |
| 6,122,171 A * | 9/2000 | Akram | H01L 24/97 361/717 |
| 6,137,170 A * | 10/2000 | Ujiie | H01L 23/3677 257/E23.105 |
| 11,121,099 B2 | 9/2021 | Ito et al. | |
| 2009/0026249 A1* | 1/2009 | Kopp | H01L 24/81 228/223 |
| 2011/0165319 A1 | 7/2011 | Kitajima et al. | |
| 2013/0109136 A1* | 5/2013 | Foote | H01L 24/83 438/115 |
| 2016/0172272 A1* | 6/2016 | Wong | H01L 24/29 257/676 |
| 2016/0254230 A1* | 9/2016 | Lee | H01L 24/97 257/659 |
| 2020/0006853 A1* | 1/2020 | Park | H05K 1/024 |

FOREIGN PATENT DOCUMENTS

| | | |
|---|---|---|
| DE | 19541334 A1 | 9/1996 |
| DE | 112016007562 T5 | 10/2019 |
| EP | 0540070 A1 | 9/1992 |

* cited by examiner

*Primary Examiner* — Nishath Yasmeen
(74) *Attorney, Agent, or Firm* — Coats & Bennett, PLLC (57) ABSTRACT

A semiconductor device comprises a lead, a board, and an electrically conductive layer on the board. The lead comprises a longitudinal axis and is soldered to the electrically conductive layer. The semiconductor device further comprises a first solder dam edge and a second solder dam edge, each positioned on the lead not more than 10 mils apart from each other along the longitudinal axis.

15 Claims, 7 Drawing Sheets

HIGH PERFORMANCE SEMICONDUCTOR DEVICE

BACKGROUND

A semiconductor device is an electrical device that includes one or more discrete and/or integrated circuits. To bond one or more electrical components of the semiconductor device together, solder is often applied. A durable material may also be used to cover or encase one or more components of the semiconductor device for its protection. To bond this covering or encasing over the components of the semiconductor device to be protected, an epoxy may be used. In this way, a semiconductor package is often provided that can be readily shipped, handled, and integrated into a wide variety of products.

Semiconductor devices and packages that are poorly designed and/or manufactured can negatively impact device performance. When a semiconductor device is intended for use in high performance environments, even small differences in the layout, arrangement, assembly, dimensions, and/or materials used in manufacturing can affect performance in significant ways, particularly when the effects are cumulatively considered.

SUMMARY

Embodiments of the present disclosure are generally directed to a semiconductor device having a lead soldered to an electrically conductive layer on a board. One or more solder dams are positioned on the lead such that first and second solder dam edges of the semiconductor device are positioned no more than 10 mils apart from each other.

Particular embodiments include a semiconductor device. The semiconductor device comprises a lead, a board, and an electrically conductive layer on the board. The lead comprises a longitudinal axis and is soldered to the electrically conductive layer. The semiconductor device further comprises a first solder dam edge and a second solder dam edge, each positioned on the lead not more than 10 mils apart from each other along the longitudinal axis.

In some embodiments, the lead further comprises a bottom surface that is soldered to the electrically conductive layer. The first solder dam edge is positioned on the bottom surface of the lead and is positioned closer than the second solder dam edge to the board. In some such embodiments, the second solder dam edge is positioned on the bottom surface of the lead and the semiconductor device further comprises a solder dam spanning the bottom surface of the lead between the first and second solder dam edges. In other such embodiments, the lead further comprises a top surface opposing the bottom surface, the second solder dam edge is positioned on the top surface, and the semiconductor device further comprises a bottom solder dam and a top solder dam. The bottom solder dam extends from the first solder dam edge beyond the second solder dam edge along the longitudinal axis, and the top solder dam extends from the second solder dam edge beyond the first solder dam edge along the longitudinal axis.

In some embodiments, the solder dam edges are positioned not more than 6 mils apart from each other along the longitudinal axis.

In some embodiments, the semiconductor device further comprises a protective lid affixed to the board by an intervening epoxy layer and covering at least a portion of the lead. In some such embodiments, along the longitudinal axis, the epoxy layer is positioned not less than 4 mils from the second solder dam edge, and the first solder dam edge is closer to the epoxy layer than the second solder dam edge.

In some embodiments, the semiconductor device further comprises a metal submount. The board is on the metal submount. The lead is also soldered to another device spaced away from the metal submount by not more than 4 mils. The lead is soldered to the board and the other device at opposite longitudinal ends of the lead.

In some embodiments, the electrically conductive layer on the board comprises radio frequency (RF) circuitry configured to support radio communication over an Ultra High Frequency (UHF) or higher frequency band.

In some embodiments, the board is a flexible printed circuit board.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

For clarity in understanding the disclosure below, to the extent that "one of" a conjunctive list of items (e.g., "one of A and B") is discussed, the present disclosure refers to one (but not both) of the items in the list (e.g., an A or a B, but not both A and B). Such a phrase does not refer to one of each of the list items (e.g., one A and one B), nor does such a phrase refer to only one of a single item in the list (e.g., only one A, or only one B). Similarly, to the extent that "at least one of" a conjunctive list of items is discussed (and similarly for "one or more of" such a list), the present disclosure refers to any item in the list or any combination of the items in the list (e.g., an A only, a B only, or both an A and a B). Such a phrase does not refer to at least one of each of the items in the list (e.g., at least one of A and at least one of B).

Figure 1:
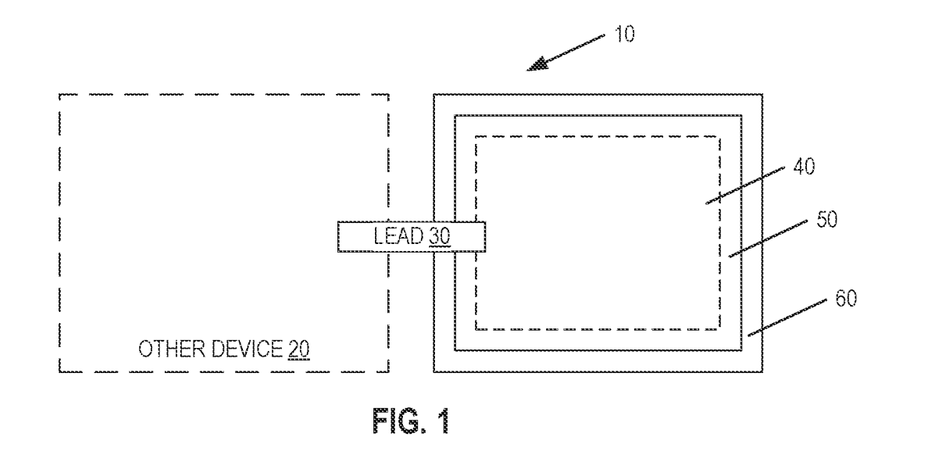
FIG. 1 is a schematic block diagram illustrating a top view of an example semiconductor device, according to one or more embodiments of the present disclosure.

FIG. 1 schematically illustrates a top-view of an example semiconductor device 10 according to one or more embodiments of the present disclosure. The semiconductor device 10 comprises a board 50, a submount 60, and a lead 30. Although the board 50 is mounted on top of the submount 60, which in this example is made of metal (e.g., copper), other embodiments of the semiconductor device 10 include a flexible printed circuit board (PCB) in addition to, or instead of, one or more of the layers discussed herein. The submount 60 in particular may be omitted in one or more such embodiments.

The board 50 is a non-conductive substrate (e.g., glass, paper, ceramic) that mechanically supports an electrically conductive layer on top of the board 50 within area 40. The electrically conductive layer comprises one or more electrically conductive circuit tracks, pads, and/or vias. The lead 30 is soldered to the electrically conductive layer on the board 50. In this regard, the lead 30 permits electrical interconnection between the electrically conductive layer on the board 50 and another device 20.

Figure 2:
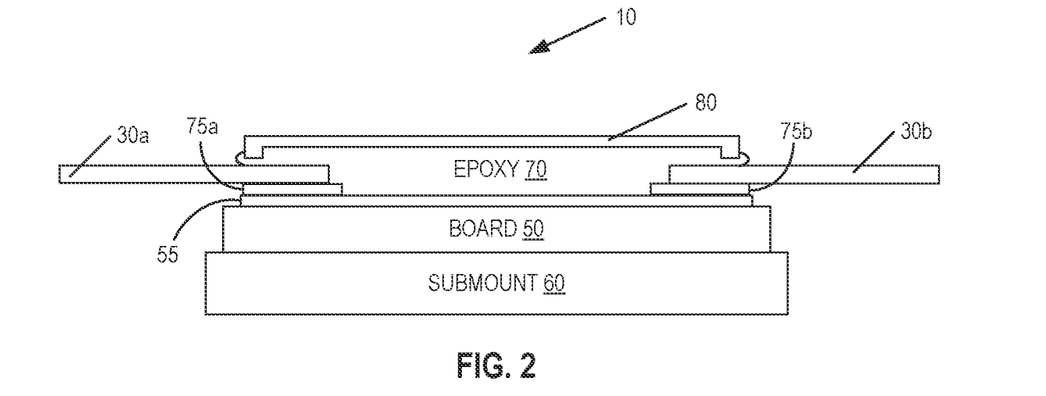
FIG. 2 is a schematic block diagram illustrating a side view of an example semiconductor device, according to one or more embodiments of the present disclosure.

It should be noted that although the semiconductor device 10 depicted in the example of FIG. 1 includes only a single lead 30, other embodiments of the semiconductor device 10 may include any number of leads as described herein. FIG. 2 is a side view of an example semiconductor device 10 that includes leads 30a, 30b extending away from the board 50 in opposite directions. Solder 75a, 75b bonds the leads 30a, 30b, respectively, to the electrically conductive layer 55 on the board 50. In the example of FIG. 2, the semiconductor device 10 also includes a protective lid 80, which is affixed to the board 50 by an intervening layer of epoxy 70. In some embodiments, the epoxy 70 is applied atop the board 50 in a ring covering each of the leads 30a, 30b, and the lid is mounted onto the ring of epoxy 70.

Figure 3A:
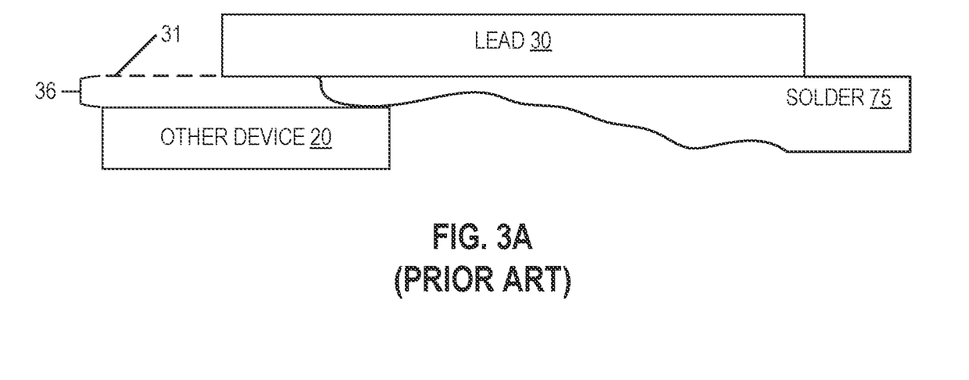
FIG. 3A is a schematic block diagram illustrating excessive solder outflow interfering with intended mounting of a semiconductor device, according to the prior art.

An outflow of the solder 75 of a lead 30 during solder wetting may be detrimental to the performance of the semiconductor device 10 in one or more ways. For example, in traditional devices (as shown in the side view of FIG. 3A), outflow of the solder 75 may cause the solder 75 to flow to an area of the lead 30 that is intended to be bonded to another device 20. Should this occur, there may be a difference 36 between the actual seating height of the semiconductor device 10 and its intended seating height 31. This difference 36 may reduce the integrity, reliability, and/or performance of the bond between the semiconductor device 10 and other device 20.

Figure 3B:
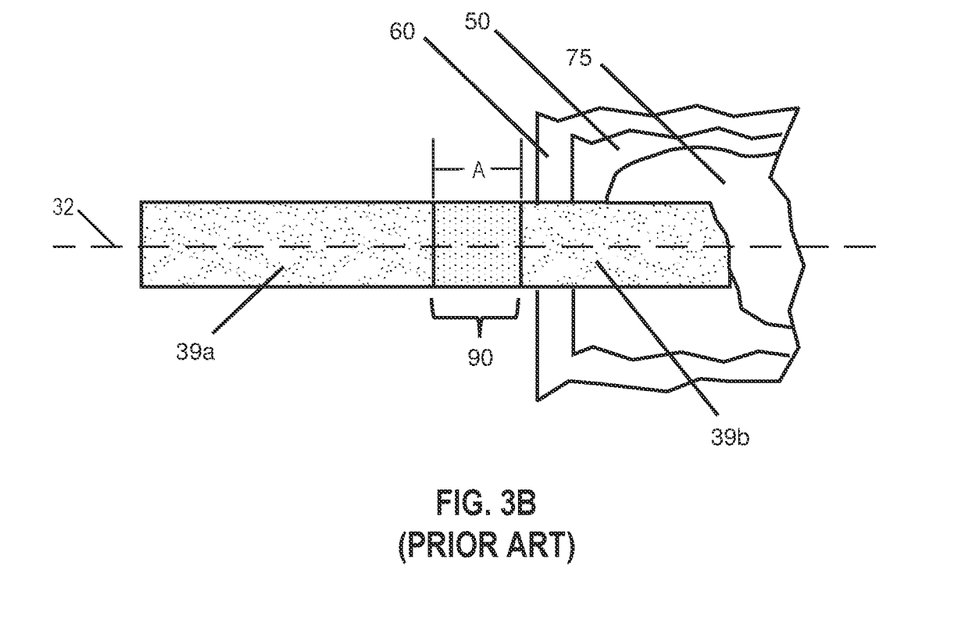
FIG. 3B is a schematic block diagram illustrating the use of a solder dam to impede solder outflow as known in the prior art.

To inhibit the solder of either or both of the devices 20, 10 from outflowing upon wetting toward the opposite longitudinal end of the lead 30, traditional devices will often position a solder dam 90 on the lead 30, e.g., as shown in FIG. 3B. The solder dam 90 renders an intermediate portion of the lead 30 between a first mount area 39a and a second mount area 39b solder-phobic. Thus, the solder 75 used to mount the lead 30 to the board 50 is effectively prevented from outflowing toward the other device 20.

Notably (and as will be discussed in further detail below), it is conventional for solder dams 90 as known in the art to be quite wide in order to enhance their solder-flow impeding attributes. Solder dams 90 as known in the prior art as applied to existing semiconductor devices are commonly found to be 18 mils wide, as measured from edge-to-edge of the solder dam 90 along a longitudinal axis 32 of the lead 30. It is also conventional for solder dams 90 as known in the art to be spaced laterally away from the board 50 and submount 60, thereby increasing the amount of outflow required before the solder 75 comes into contact with the solder dam 90. In general, the outflow distance before encountering the solder dam, in combination with a substantial solder dam width, has been highly effective in the prior art to prevent solder 75 used to bond the lead in the second mount area 39b from crossing into the first mount area 39a where the outer device 20 will be mounted.

Figure 4A:
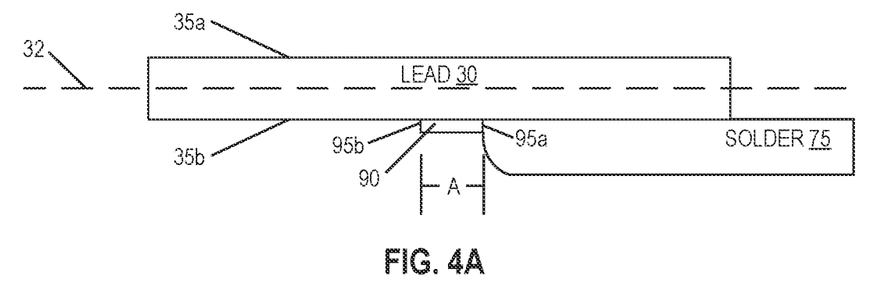
FIG. 4A is a schematic block diagram illustrating a side view of an example lead of a semiconductor device, according to one or more embodiments of the present disclosure.

FIG. 4A illustrates a side view of an example of a lead 30 in accordance with one or more embodiments of the present disclosure. The lead 30 comprises a top surface 35a and a bottom surface 35b that is opposite the top surface 35a. The bottom surface 35b of the lead 30 is soldered to the electrically conductive layer 55. A solder dam 90 is positioned on the bottom surface 35b of the lead 30. As shown in FIG. 4A, solder 75 of the semiconductor device 10 has flowed up to, but not over, the solder dam 90 upon wetting.

In the example of FIG. 4A, the solder dam 90 is a thin layer of solder-phobic material, such as an ink or resin containing a polymer, silicone, epoxy, polymide or other substance that inhibits solder wetting or flow. That said, any one or more of the solder dams 90 of the various embodiments described herein may be formed in other ways. For example, any one or more of the solder dams 90 described herein may be positioned upon a lead 30 through, e.g., laser ablation or chemical etching. Accordingly, the solder dam 90 may, in some embodiments, be more accurately viewed as notched into the lead 30 (not shown), rather than atop the lead 30 as shown in FIG. 4A.

Although a wider solder dam would generally tend to be more effective at inhibiting outflow of the solder 75 relative to a narrower solder dam, testing of various prototypes of the semiconductor device 10 has revealed that solder dam width may, in some embodiments, be advantageously reduced in order to shorten the trace length of the lead 30 and/or to enable closer mounting of the semiconductor device 10 to the other device 20. Accordingly, embodiments of the present disclosure include a solder dam 90 that is not more than 10 mils wide, as measured between a first solder dam edge 95a and a second solder dam edge 95b along a longitudinal axis 32 of the lead 30, denoted by dimension A in FIG. 4A. Indeed, in some particular embodiments of the present disclosure, the distance between solder dam edges 95a, 95b as measured along the longitudinal axis 32 is not more than 6 mils. In some particularly aggressive embodiments, the distance between solder dam edges 95a, 95b as measured along the longitudinal axis 32 is not more than 4 mils.

To be clear, as discussed herein, distance "along" an axis means a distance that is parallel to the axis and not necessarily on the axis itself. Thus, in FIG. 4A, the distance between the first and second solder dam edges 95a, 95b as measured along the longitudinal axis 32 is dimension A, even though neither of the solder dam edges 95A, 95b intersects the longitudinal axis 32.

Figure 4B:
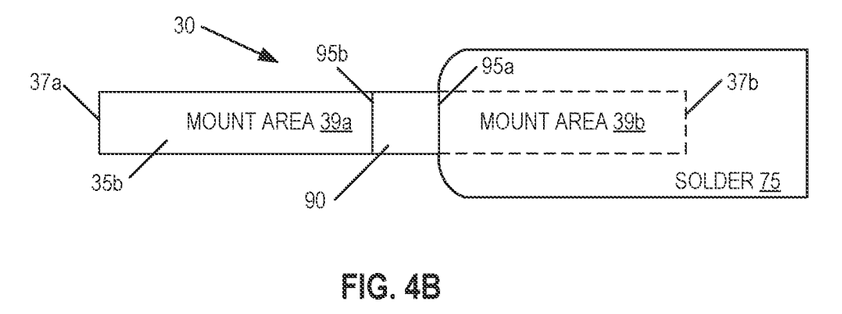
FIG. 4B is a schematic block diagram illustrating a bottom view of an example lead of a semiconductor device, according to one or more embodiments of the present disclosure.

The areas of the bottom surface 35b that are not covered by the solder dam 90 may be considered areas that are available for mounting a device. FIG. 4B illustrates a bottom view of the lead 30, in relation to the solder 75 used to bond the lead 30 to the electrically conductive layer 55 on the board 50. The lead 30 comprises a first mount area 39a and a second mount area 39b. The first mount area 39a extends between a first end 37a of the lead 30 and a first solder dam edge 95a. The second mount area 39b extends between a second end 37b of the lead 30 and a second solder dam edge 95b. The solder dam 90 spans the bottom surface 35b of the lead 30 between the first and second solder dam edges 95a, 95b.

The lead 30 is soldered to the electrically conductive layer 55 by the solder 75 at mount area 39b, whereas mount area 39a is available to be soldered to the other device 20. Spacing the solder dam edges 95a, 95b close together allows of larger mount areas 39a, 39b, which may advantageously provide better contact with their respective devices 10, 20.

Figure 4C:
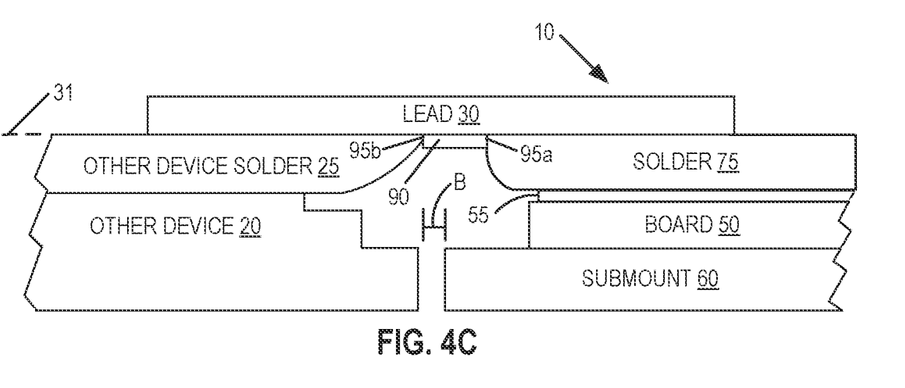
FIG. 4C is a schematic block diagram illustrating a side view of an example lead of a semiconductor device mounted to another device, according to one or more embodiments of the present disclosure.

FIG. 4C illustrates an example of the lead 30 bonded to both the electrically conductive layer 55 of the semiconductor device 10 and to the other device 20 by solder 75, 25, respectively. The semiconductor device 10 comprises a first solder dam edge 95a and a second solder dam edge 95b. The first solder dam edge 95a is closer to the board 50 than the second solder dam edge 95b.

More particularly (and as discussed above), the solder dam 90 is sufficiently narrow to permit the semiconductor device 10 and other device 20 to be mounted quite close to each other, at the intended seating height 31, and with a substantial majority of the mounting areas 39a, 39b of the lead 30 in electrical contact with their respective devices 20, 10. In this particular example, the other device 20 is spaced away from the submount 60 by not more than 4 mils (denoted in FIG. 4C by dimension B). In other examples, the other device 20 is mounted such that the submount 60 is adjacent to the other device with no intervening gap.

In at least some embodiments, the solder dam 90 may be positioned anywhere on the lead 30 that is not directly over solder 75. That said, particular embodiments of the present disclosure advantageously include a solder dam 90 that is positioned at least mostly over the submount 60, as shown in the example of FIG. 4C. In testing, such positioning allowed for the semiconductor device 10 and other device 20 to be mounted such that the distance between the submount 60 and other device 20 as measured along the longitudinal axis 32 of the lead was reduced as discussed above (i.e., not more than 4 mils).

Figure 4D:
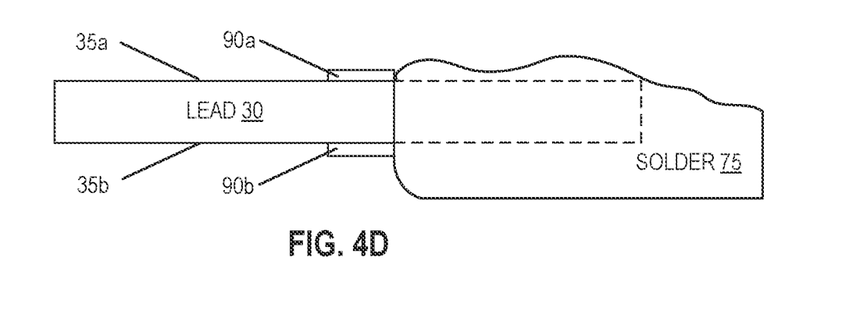
FIG. 4D is a schematic block diagram illustrating a side view of an example lead of a semiconductor device having a plurality of solder dams, according to one or more embodiments of the present disclosure.

Although the solder dam 90 of FIGS. 4A-C is positioned on a bottom surface 35b of the lead 30, other embodiments include a solder dam 90 that is additionally or alternatively positioned on the top surface 35a of the lead 30. FIG. 4D, for example, illustrates a first solder dam 90a positioned on the top surface 35a of the lead 30, and a second solder dam 90b positioned on a bottom surface 35b of the lead 30. In this example, each of the solder dams 90a, 90b inhibits outflow of the solder 75 over the respective surfaces 35a, 35b of the lead 30 on which they are positioned. As previously discussed, solder outflow from the other device 20 towards the semiconductor device 10 would be similarly impeded, e.g., when soldering the lead 30 to the other device 20.

Figure 4E:
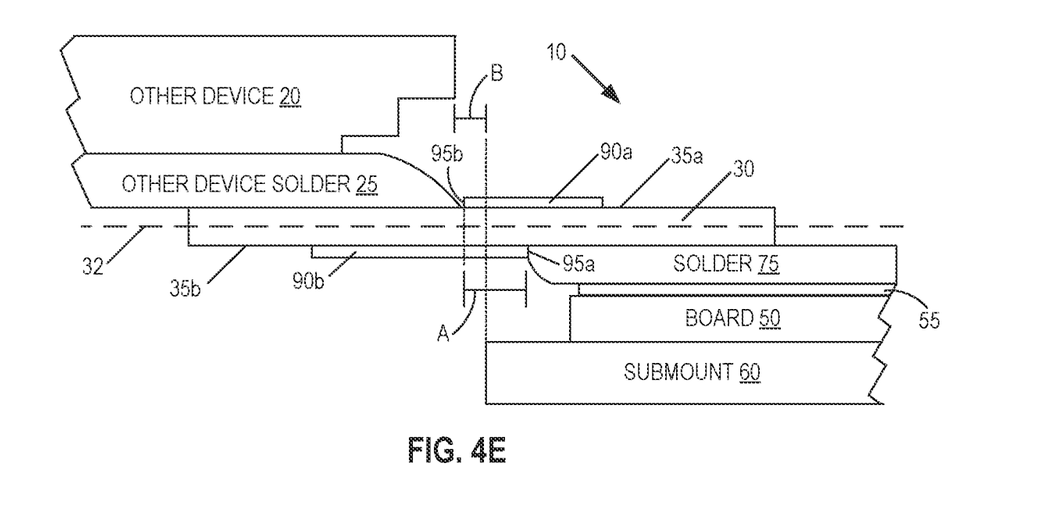
FIG. 4E is a schematic block diagram illustrating a side view of an example lead of a semiconductor device mounted to another device, according to one or more embodiments of the present disclosure.

It should also be noted that although FIG. 4C depicts the other device 20 as being mounted such that it extends under the bottom surface 35b of the lead 30, according to other embodiments the other device 20 may be mounted such that it extends over the top surface 35a, as shown in FIG. 4E. Additionally or alternatively, although FIG. 4D depicts solder dams 90a and 90b as being substantially the same size, according to other embodiments, the solder dams 90a and 90b may have different widths as shown in FIG. 4E.

In this particular example, the second solder dam edge 95b is positioned on the top surface 35a of the lead 30, and the first solder dam edge 95 is positioned on the bottom surface 35b of the lead 30. The bottom solder dam 90b extends from the first solder dam edge 95a beyond the second solder dam edge 95b along the longitudinal axis 32. The top solder dam 90a extends from the second solder dam edge 95b beyond the first solder dam edge 95a along the longitudinal axis 32.

Notwithstanding such variations, the semiconductor device 10 nonetheless comprises a first solder dam edge 95a and a second soldier dam edge 95b, each positioned on the lead 30 not more than 10 mils, 6 mils, or even 4 mils apart from each other along the longitudinal axis 32, as indicated by dimension A. As discussed above, the narrowness of dimension A may permit the semiconductor device 10 and the other device 20 to be mounted in close proximity to each other. Such may be true in any of the various embodiments discussed herein.

Figure 5A:
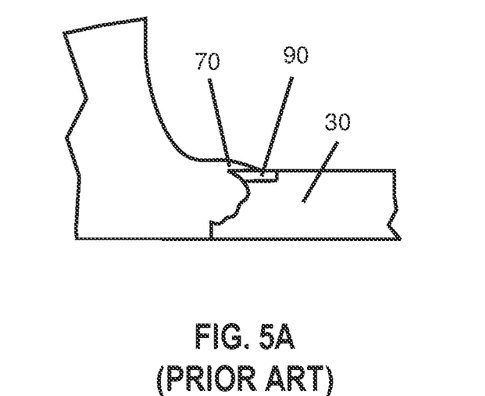
FIG. 5A is a line drawing illustrating a side view of epoxy outflow onto a lead of a semiconductor device as known in the prior art.

As mentioned above, the semiconductor device 10 may comprise a protective lid affixed to the board 60 by a layer of epoxy 70. When the epoxy 70 is applied during assembly of the semiconductor device 10, the epoxy 70 is generally fluid, which means that the epoxy 70 may have a tendency to outflow away from the semiconductor device 10. Indeed, this tends to occur in conventional devices as known in the prior art. FIG. 5A illustrates an example in which epoxy 70 has outflowed onto the lead 30 and over a solder dam 90 of a conventional device as known in the existing art.

Figure 5B:
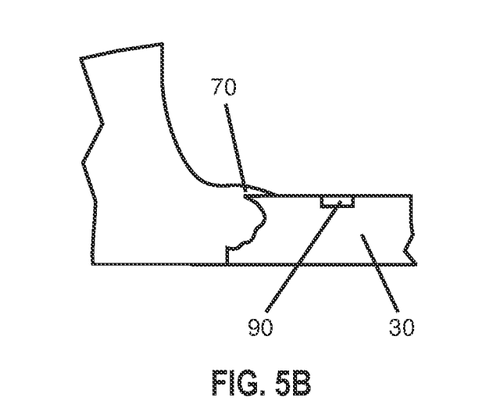
FIG. 5B is a line drawing illustrating a side view of epoxy outflow onto a lead of a semiconductor device according to one or more embodiments of the present disclosure.

The outflow of the epoxy 70 over the solder dam 90 causes the solder dam 90 to lose effectiveness at impeding the flow of solder 75. Accordingly, particular embodiments of the present disclosure space the epoxy 70 away from the solder dam 90, as illustrated in FIG. 5B.

Figure 5C:
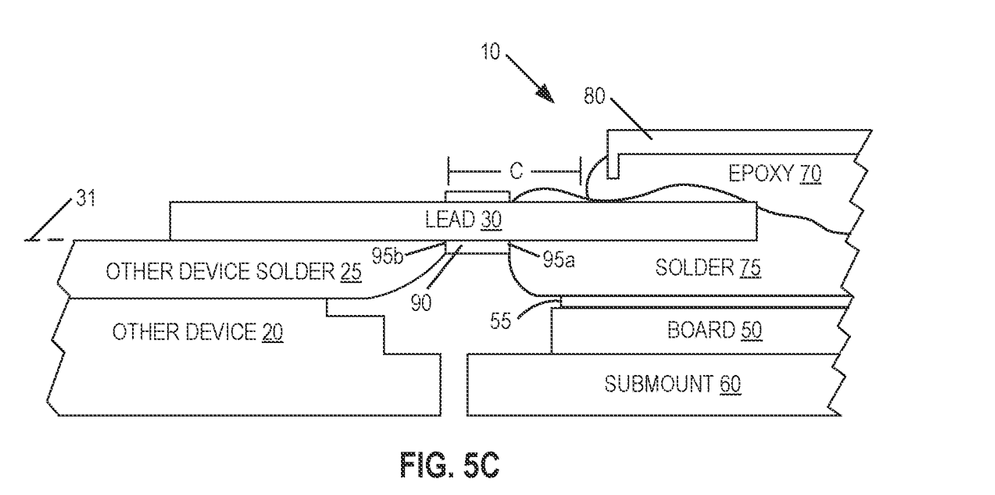
FIG. 5C is a schematic block diagram illustrating a side view of an example semiconductor device comprising a lid mounted by a layer of epoxy according to one or more embodiments of the present disclosure.

A particular example arrangement of the solder dam 90 relative to the epoxy 70 and solder 75 of the semiconductor device 10 is shown in FIG. 5C. As shown in FIG. 5C, the epoxy 75 is applied such that the distance between the layer of epoxy 70 and the second solder dam edge 95b (denoted by dimension C) is not less than 4 mils along the longitudinal axis 32. By positioning the epoxy layer not less than 4 mils from the second solder dam edge 95b, the intended function of the solder dams 95a, 95b is not significantly impeded by epoxy outflow.

The above describes a variety of embodiments of a semiconductor device 10 that, by careful balancing of engineering factors, provides a design that may be particularly advantageous for high performance applications in which a short trace length and/or compact mounting are important. In this regard, the electrically conductive layer 55 on the board 60 may comprise radio frequency (RF) circuitry configured to support radio communication over an Ultra High Frequency (UHF) or higher frequency band.

Figure 6A:
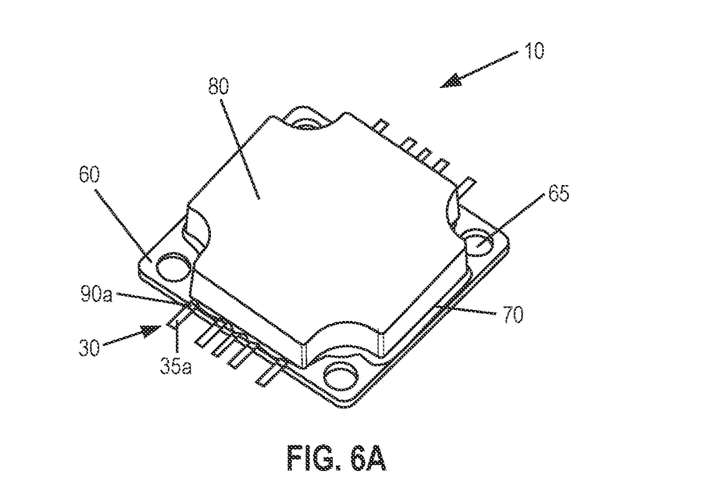
FIG. 6A is a line drawing illustrating an isometric view of a semiconductor device according to one or more embodiments of the present disclosure.

A particular example of a semiconductor device 10 in accordance with one or more of the embodiments described above is illustrated in FIGS. 6A-C. FIG. 6A is an isometric line drawing illustrating an example semiconductor device 10, whereas FIGS. 6B and 6C are top and bottom views, respectively, of the semiconductor device 10.

The semiconductor device 10 comprises a protective lid 80 affixed to a board 50 on a metal submount 60 by an intervening layer of epoxy 70. As can be seen in FIGS. 6A and 6B, the epoxy 70 in this example has slightly outflowed from under the lid 80 and covers a plurality of leads 30, each of which extends laterally away from between the lid 80 and submount 60. Each of the leads 30 comprises a solder dam 90 on each of the top and bottom sides of the lead 30.

The semiconductor device 10 in this example is in a bolt-down package configuration. In this regard, a plurality of mounting holes 65 extend through the submount 60. Each of the mounting holes 65 permits a fastener (e.g., a bolt or screw, not shown) to be passed through the submount 60 and into a mounting surface, so that the semiconductor may be mounted onto the mounting surface.

Figure 6B:
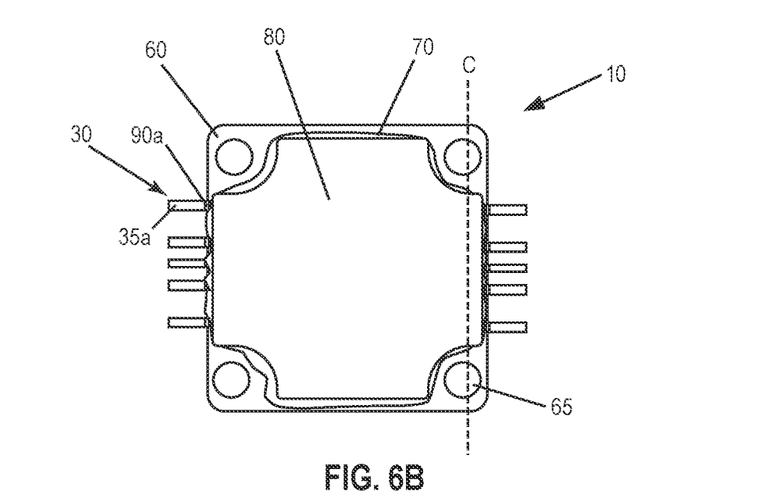
FIG. 6B is a line drawing illustrating an top view of a semiconductor device according to one or more embodiments of the present disclosure.
Figure 6C:
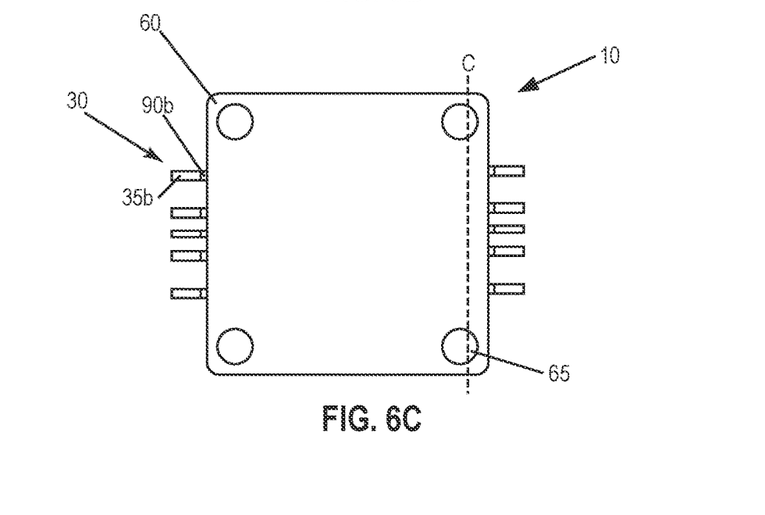
FIG. 6C is a line drawing illustrating a bottom view of a semiconductor device according to one or more embodiments of the present disclosure.
Figure 7:
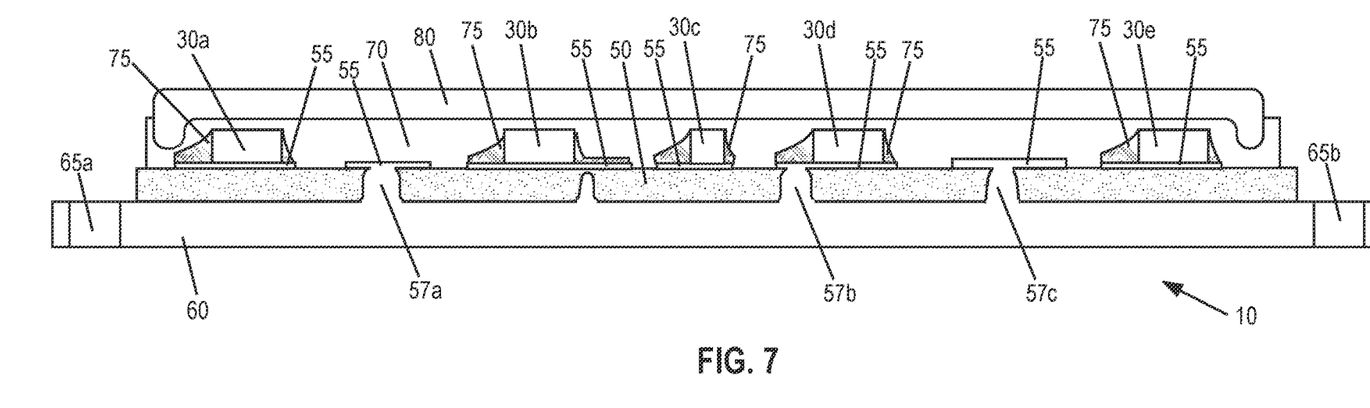
FIG. 7 is a line drawing of a cross-sectional view of a semiconductor device according to one or more embodiments of the present disclosure.

A cross-section of the semiconductor device 10 illustrated in FIGS. 6A-6C is provided in FIG. 7 along line C. From FIG. 7, the layers of the semiconductor device 10 can be readily appreciated. As shown in FIG. 7, the semiconductor device 10 comprises a board 50 disposed on a submount 60. A plurality of mounting holes 65a, 65b extend through the submount 60. An electrically conductive layer 55 is disposed on the board 50. Each of a plurality of leads 30a-e is bonded by solder 75 to the electrically conductive layer 55 on the board 50. The lid 80 is affixed to the board 50 by a layer of epoxy 70. The electrically conductive layer 55, in this example, comprises a plurality of vias 57a-c that extend through the board 55 to the submount 60. In this regard, the vias 57a-c may serve as ground vias for the electrically conductive layer 55.

Figure 8A:
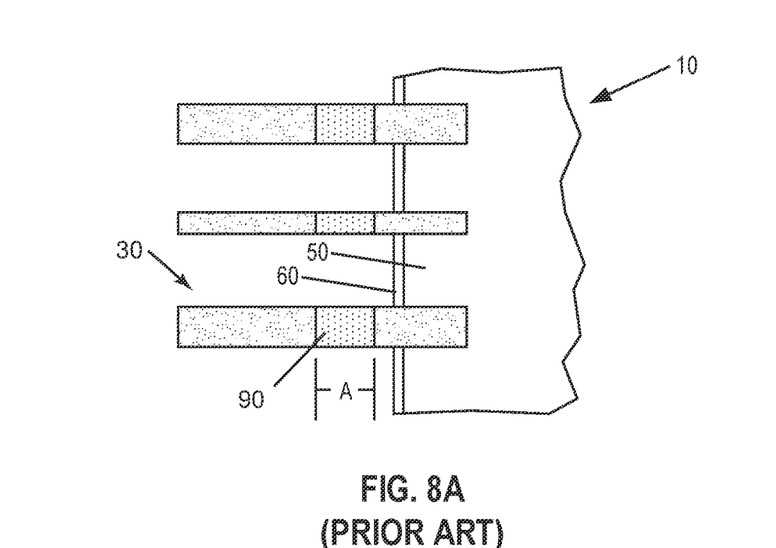
FIG. 8A is a line drawing of solder dams on respective leads of a semiconductor device as known in the prior art.

The semiconductor device 10 improves on known design techniques. FIG. 8A illustrates a semiconductor device 10 comprising a lead 30 as known in the prior art. The lead 30 comprises a solder dam 90 that is spaced laterally away from the submount 60 and board 50. Moreover, the solder dam 90 traditionally measures 18 mils or more from edge-to-edge (denoted by dimension A) in a direction along its longitudinal axis.

Figure 8B:
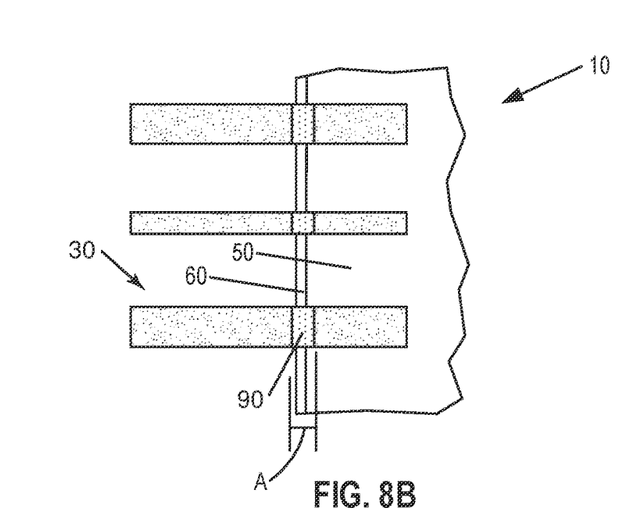
FIG. 8B is a line drawing of solder dams on respective leads of a semiconductor device according to one or more embodiments of the present disclosure.

In contrast, FIG. 8B illustrates an example semiconductor device 10 comprising a lead in accordance with embodiments of the present disclosure. In FIG. 7B, the lead 30 comprises a solder dam 90 that is mostly positioned over the submount 60 and partly over the board 50. Indeed, some embodiments of the present disclosure include a solder dam 90 that is positioned entirely over the submount 60 and/or the board 50. Other embodiments include a solder dam 90 that is positioned mostly over the submount 60 but not over the board 50. In further contrast to known device of FIG. 8A, the solder dam 90 of FIG. 8B comprises edges that are not more than 10 mils apart from each other in a direction along a longitudinal axis of the lead 30 (shown by dimension A).

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A semiconductor device comprising:
a lead comprising a longitudinal axis, a bottom surface, and a top surface opposing the bottom surface;
a board and an electrically conductive layer on the board, wherein the bottom surface of the lead is soldered to the electrically conductive layer;
a first solder dam edge and a second solder dam edge, each positioned on the lead not more than 10 mils apart from each other along the longitudinal axis, wherein the first solder dam edge is positioned on the bottom surface of the lead and is positioned closer than the second solder dam edge to the board, and the second solder dam edge is positioned on the top surface;
a bottom solder dam that extends from the first solder dam edge beyond the second solder dam edge along the longitudinal axis; and
a top solder dam that extends from the second solder dam edge beyond the first solder dam edge along the longitudinal axis.

2. The semiconductor device of claim 1, wherein the first solder dam edge and the second solder dam edge are positioned not more than 6 mils apart from each other along the longitudinal axis.

3. The semiconductor device of claim 1, further comprising a protective lid affixed to the board by an intervening epoxy layer and covering at least a portion of the lead.

4. The semiconductor device of claim 3, wherein along the longitudinal axis:
the epoxy layer is positioned not less than 4 mils from the second solder dam edge; and
the first solder dam edge is closer to the epoxy layer than the second solder dam edge.

5. The semiconductor device of claim 1, further comprising a metal submount, wherein:
the board is on the metal submount;
the lead is also soldered to another device spaced away from the metal submount by not more than 4 mils; and
the lead is soldered to the board and the other device at opposite longitudinal ends of the lead.

6. The semiconductor device of claim 1, wherein the electrically conductive layer on the board comprises radio frequency (RF) circuitry configured to support radio communication over an Ultra High Frequency (UHF) or higher frequency band.

7. The semiconductor device of claim 1, wherein the board is a flexible printed circuit board.

8. A semiconductor device comprising:
a metal submount, a board on the metal submount, and an electrically conductive layer on the board;
a lead comprising a longitudinal axis and soldered, at opposite longitudinal ends of the lead, to the electrically conductive layer and to another device spaced away from the metal submount by not more than 4 mils; and
a first solder dam edge and a second solder dam edge, each positioned on the lead not more than 10 mils apart from each other along the longitudinal axis.

9. The semiconductor device of claim 8, wherein:
the lead further comprises a bottom surface that is soldered to the electrically conductive layer;
the first solder dam edge is positioned on the bottom surface of the lead and is positioned closer than the second solder dam edge to the board.

10. The semiconductor device of claim 9, wherein:
the second solder dam edge is positioned on the bottom surface of the lead;
the semiconductor device further comprises a solder dam spanning the bottom surface of the lead between the first and second solder dam edges.

11. The semiconductor device of claim 8, wherein the first solder dam edge and the second solder dam edge are positioned not more than 6 mils apart from each other along the longitudinal axis.

12. The semiconductor device of claim 8, further comprising a protective lid affixed to the board by an intervening epoxy layer and covering at least a portion of the lead.

13. The semiconductor device of claim 12, wherein along the longitudinal axis:
the epoxy layer is positioned not less than 4 mils from the second solder dam edge; and
the first solder dam edge is closer to the epoxy layer than the second solder dam edge.

14. The semiconductor device of claim 8, wherein the electrically conductive layer on the board comprises radio frequency (RF) circuitry configured to support radio communication over an Ultra High Frequency (UHF) or higher frequency band.

15. The semiconductor device of claim 8, wherein the board is a flexible printed circuit board.

* * * * *